United States Patent [19]
Bond

[11] Patent Number: 5,631,877
[45] Date of Patent: May 20, 1997

[54] NARROWBAND SIGNAL REVEALER

[75] Inventor: James W. Bond, San Diego, Calif.

[73] Assignee: The United States of America as represented by the Secretary of the Navy, Washington, D.C.

[21] Appl. No.: 585,064

[22] Filed: Jan. 11, 1996

[51] Int. Cl.$^6$ ....................................................... H04B 1/06
[52] U.S. Cl. ........................................... 367/135; 367/901
[58] Field of Search ..................................... 367/135, 901; 364/574, 572, 724.12, 724.13, 724.19, 724.17

[56] References Cited

U.S. PATENT DOCUMENTS

| | | |
|---|---|---|
| 3,634,760 | 1/1972 | Murtin et al. . |
| 3,668,702 | 6/1972 | Jones . |
| 4,232,381 | 11/1980 | Rennick et al. . |
| 4,243,935 | 1/1981 | McCool et al. . |
| 4,417,249 | 11/1983 | Zscheile, Jr. . |
| 4,964,087 | 10/1990 | Widrow . |
| 4,975,891 | 12/1990 | Wineland et al. . |
| 5,103,431 | 4/1992 | Freeman et al. . |
| 5,117,401 | 5/1992 | Feintuch . |
| 5,130,952 | 7/1992 | Feintuch et al. . |
| 5,144,595 | 9/1992 | Graham et al. . |
| 5,226,016 | 7/1993 | Christman . |
| 5,289,194 | 2/1994 | Schlosser ............................... 342/378 |

*Primary Examiner*—Daniel T. Pihulic
*Attorney, Agent, or Firm*—Harvey Fendelman; Michael A. Kagan; Eric James Whitesell

[57] ABSTRACT

The narrowband signal revealer comprises a sensor, a baseband generator, an adaptive locally optimum processor (ALOP), and a complex signal spectral analyzer. The sensor generates an input signal representative of a tonal signal masked by wideband interference. The baseband generator transforms the input signal into a complex baseband signal. The ALOP processes the complex baseband signal to suppress the interference and generates a complex output signal representative of the tonal signal. The spectral analyzer then analyzes the complex output signal and displays tonal signal power.

14 Claims, 6 Drawing Sheets

NARROWBAND SIGNAL REVEALER

BACKGROUND OF THE INVENTION

The narrowband signal revealer of the present invention relates generally to a method for discovering signals with strong spectral features in the presence of stronger interfering signals. More particularly, the present invention relates to a method for detecting a narrowband signal masked by interfering signals having several times the magnitude of the desired signal.

Tonal signals are widely used in the identification of marine vessels, machinery malfunctions and the like. In many environments, however, tonal signals may be masked by stronger broadband signals. A need therefore exists for a method of revealing tonal signals that would normally not be detected because of the stronger masking signals.

SUMMARY OF THE INVENTION

The narrowband signal revealer of the present invention addresses the problems described above and may provide further related advantages.

The narrowband signal revealer comprises a sensor, a baseband generator, an adaptive locally optimum processor (ALOP), and a complex signal spectral analyzer. The sensor generates an input signal representative of a tonal signal masked by wideband interference. The baseband generator transforms the input signal into a complex baseband signal. The ALOP processes the complex baseband signal to suppress the interference and generates a complex output signal representative of the tonal signal. The spectral analyzer then analyzes the complex output signal and displays tonal signal power.

Other objects, advantages and new features of the invention will become apparent from the following detailed description of the invention when considered in conjunction with the accompanying drawings.

DESCRIPTION OF THE INVENTION

Figure 1:
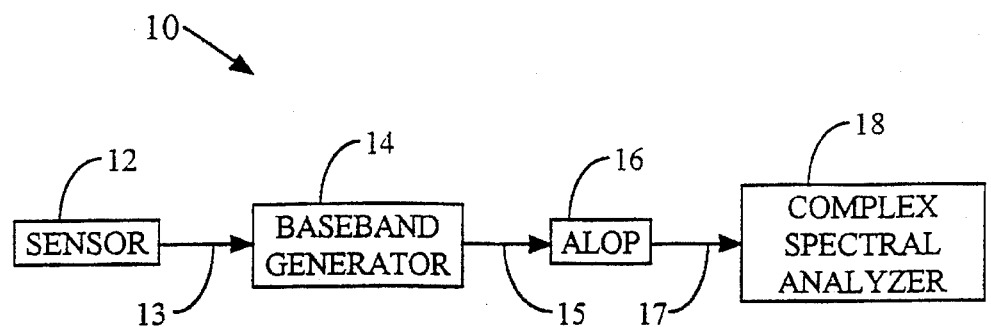
FIG. 1 is a block diagram of a narrowband signal revealer of the present invention.

In FIG. 1, narrowband signal revealer 10 comprises a sensor 12 for generating an input signal 13 representative of a tonal signal masked by wideband interference. A baseband generator 14 translates the frequency band of the tonal signal to baseband and generates a complex baseband signal 15. An adaptive locally optimum processor 16 processes complex baseband signal 15 to suppress the wideband interference and generates a combined output 17. A complex spectral analyzer 18 analyzes combined output 17 and displays the signal power in the tonal signal of input signal 13.

By way of example, if sensor 12 is a hydrophone, input signal 13 may comprise a multiple tonal signal from maritime traffic and background noise that masks the tonal signal. If sensor 12 is a communications receiver, input signal 13 may comprise an M-ary Frequency Shift Keyed (MFSK) signal masked by wideband interference.

Figure 2:
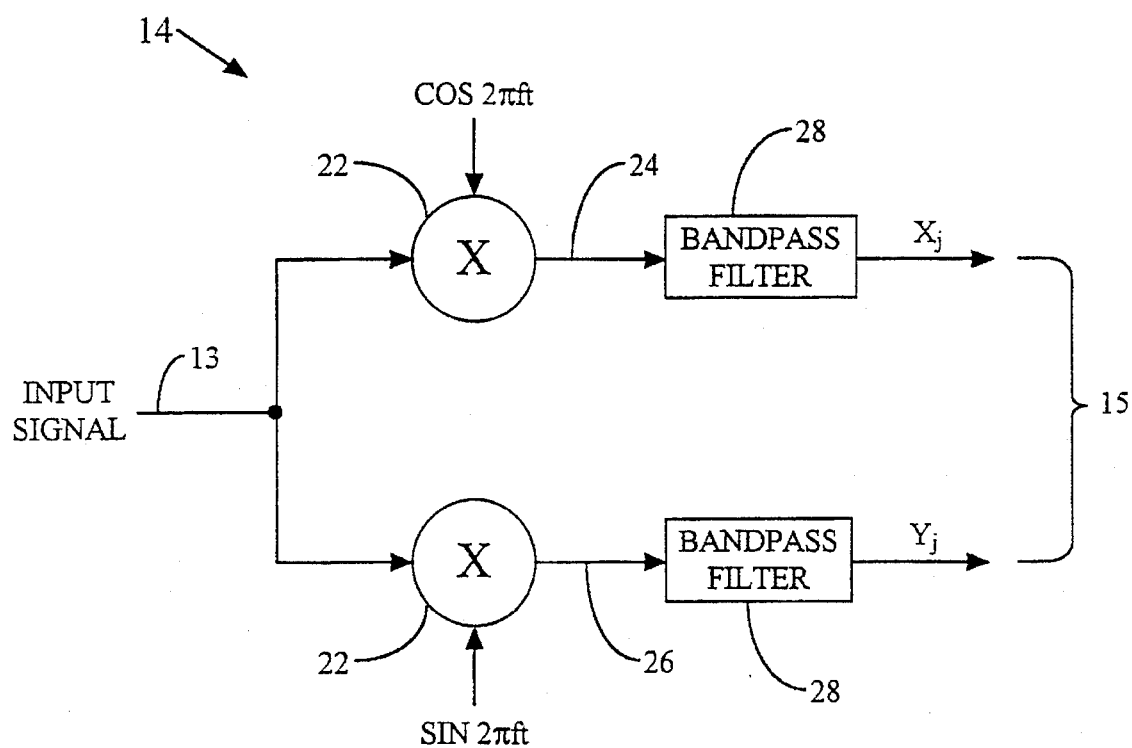
FIG. 2 is a block diagram of a baseband generator for the narrowband signal revealer in FIG. 1.

By way of example, baseband generator 14 may be implemented as shown in FIG. 2. Multipliers 22 multiply input signal 13 by $\cos 2\pi ft$ and $\sin 2\pi ft$ to generate in-phase product 24 and quadrature product 26 respectively, where f is a translation frequency and t is an appropriate time variable. Translation frequency f may be a frequency in the center of a frequency band encompassing input signal 13. Bandpass filters 28 suppress signals outside the band encompassing signal 13 and output an in-phase signal series $x_j$ and quadrature signal series $y_j$. Series $x_j$ and $y_j$ comprise a complex baseband signal 15.

Figure 3:
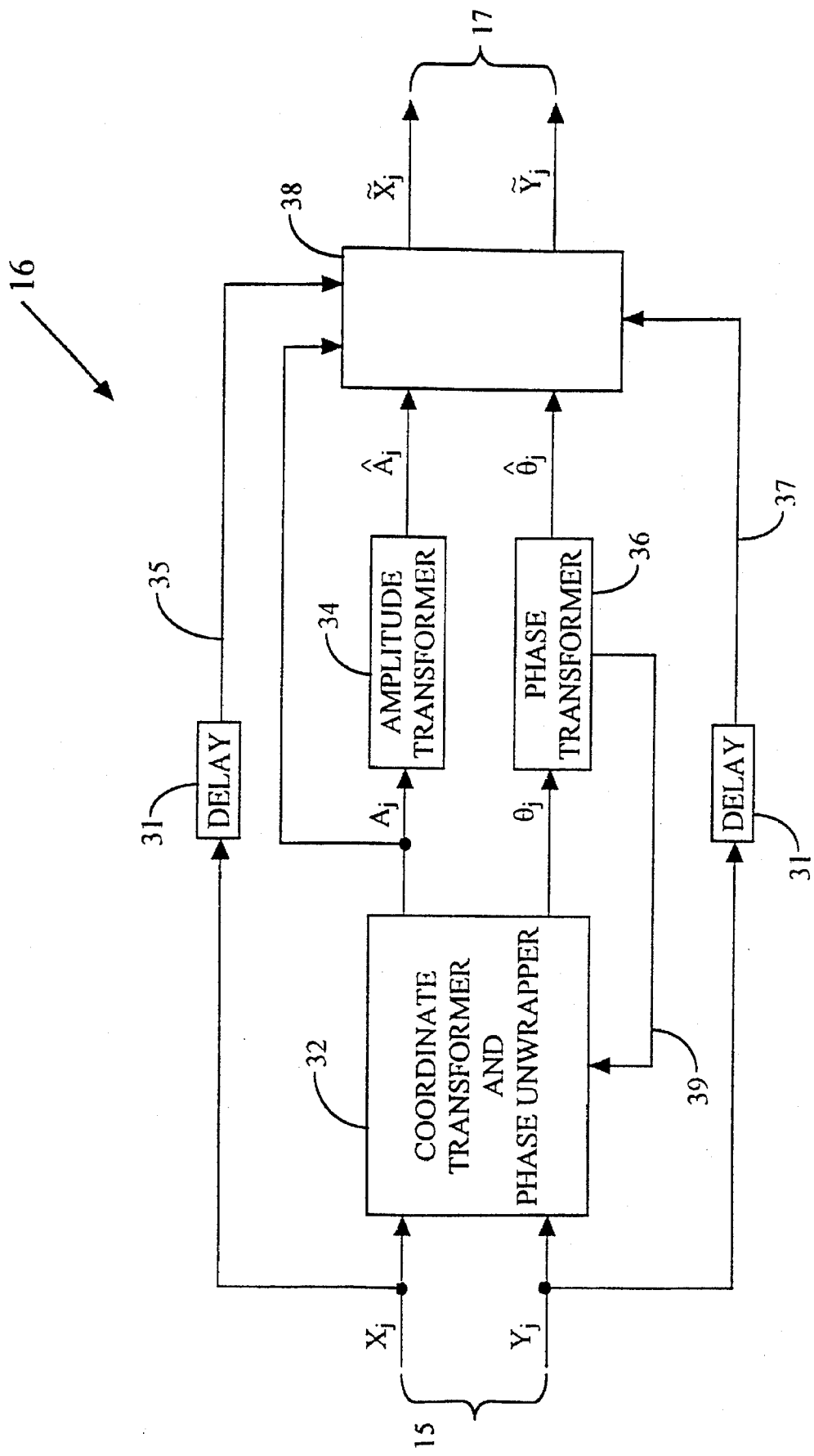
FIG. 3 is a block diagram of an adaptive locally optimum processor for the narrowband signal revealer in FIG. 1.

By way of example, adaptive locally optimum processor 16 may be implemented as shown in FIG. 3. A coordinate transformer/phase unwrapper 32 inputs complex baseband signal 15 and a phase correction 39 and outputs an amplitude series $A_j$ and an unwrapped phase series $\theta_j$ associated with an in-phase/quadrature vector $(x_j, y_j)$. An amplitude transformer 34 generates an amplitude transform sum $$\hat{A}_j = \frac{1}{2N} \sum_{k=-N}^{N} (A_j - A_{j+k}),$$

where N is a positive even integer, preferably 8. Similarly, a phase transformer 36 generates a phase transform sum $$\hat{\theta}_j = \frac{1}{2N} \sum_{k=-N}^{N} (\theta_j - \theta_{j+k}).$$

Delays 31 delay in-phase series $x_j$ and quadrature series $y_j$ to output delayed series 35 and 37, respectively. A combiner 38 inputs amplitude series $y_j$, delayed series 35 and 37, amplitude transform sum $\hat{A}_j$, and phase transform sum $\hat{\theta}_j$ to calculate a combined output 17 according to the formula $$Z_j = \left( \frac{x_j}{A_j}, \frac{y_j}{A_j} \right) \hat{A}_j + (-y_j, x_j)\hat{\theta}_j = (\hat{x}, \hat{y}).$$

Figure 4:
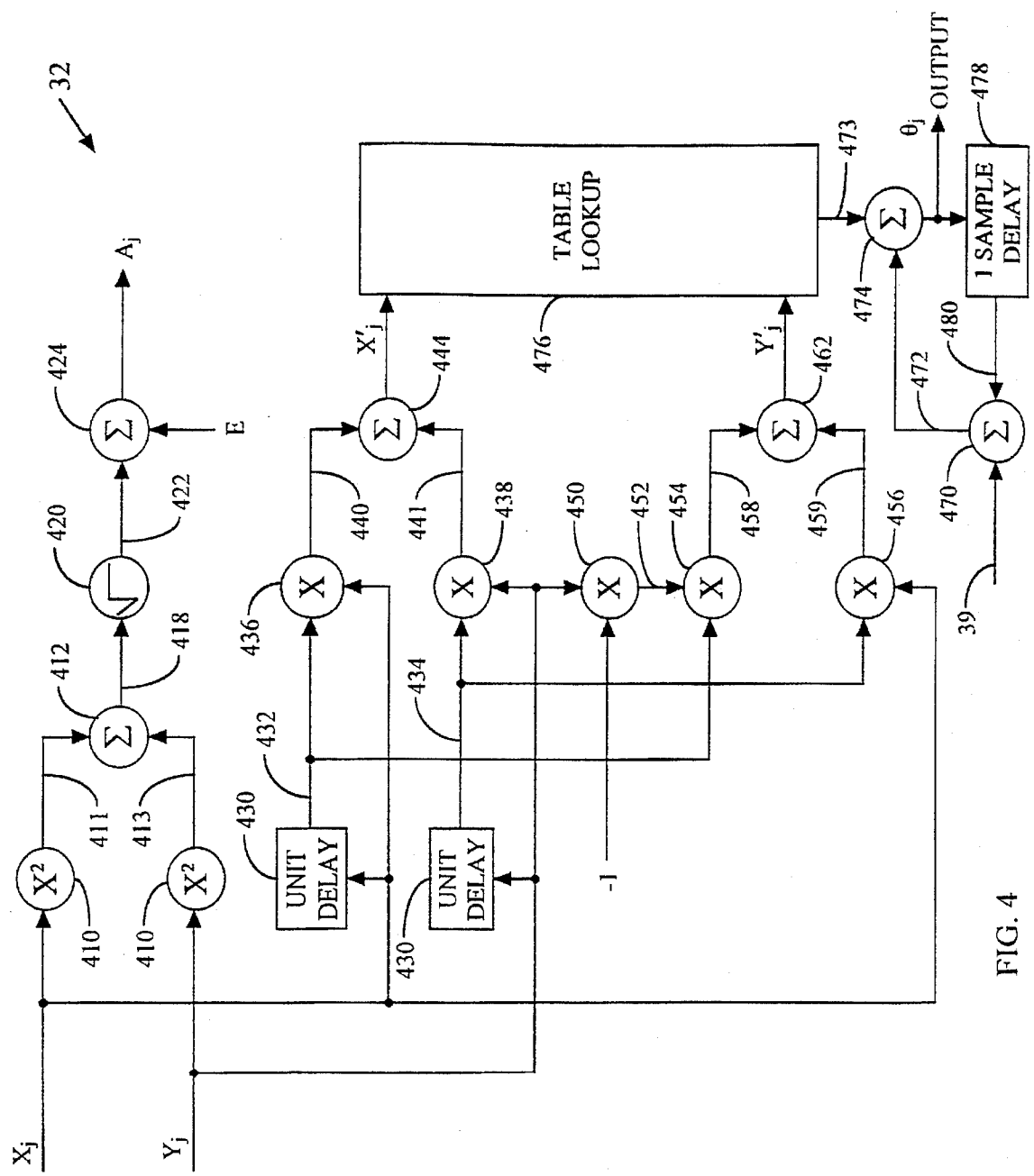
FIG. 4 is a block diagram of a coordinate transformer and phase unwrapper for the adaptive locally optimum processor of FIG. 3.

By way of example, coordinate transformer/phase unwrapper 32 may be implemented as shown in FIG. 4. Squaring functions 410 form the squares of $x_j$ and $y_j$, respectively. Summing function 412 adds squared outputs 411 and 413 from squaring functions 410 and outputs a sum square output 418. A square root function 420 computes a square root 422 from sum square output 418. A summing function 424 adds a non-zero bias E to square root 422 and outputs amplitude series $A_j$. Bias E ensures that each sample of amplitude series $A_j$ is greater than zero and preferably has a value represented by the smallest positive number that may be expressed in the arithmetic precision used to compute the above functions.

Still referring to FIG. 4, unit delays 430 input $x_j$ and $y_j$, respectively and output unit-delayed in-phase series 432 and unit-delayed quadrature series 434, respectively. A first multiplier 436 multiplies $x_j$ with unit-delayed in-phase series 432. A second multiplier 438 multiplies $y_j$ with unit-delayed quadrature series 434. In-phase products 440 and 441 from multipliers 436 and 438 are added by an in-phase summing function 444 to form a rotated in-phase series $x'_j$.

A sign inverter 450 inverts the sign of $y_j$ and outputs an inverted quadrature series 452. A third multiplier 454 multiplies unit-delayed in-phase series 432 with inverted quadrature series 452. A fourth multiplier 456 multiplies unit-delayed quadrature series 434 with $x_j$. Quadrature products 458 and 459 from third multiplier 454 and fourth multiplier 456 are summed by a quadrature summing function 462 to form a rotated quadrature series $y'_j$. Rotated in-phase series $x'_j$ and rotated quadrature series $y'_j$ are associated with a rotated vector $(x',y')$.

A table lookup function 476 generates a phase increment 473 from from rotated vector $(x',y')$ using the formula $\delta(\theta_{j+1})=\arctan(y'_j/x'_j)$. Unwrapped phase series $\theta_j$ may then be calculated incrementally from the formula $\theta_{j+1}=\theta_j+\delta(\theta_{j+1})$. Accordingly, a phase summing function 474 computes unwrapped phase series $\theta_j$ by summing phase increment 473 with a phase correction sum 472. A sample delay function 478 inputs unwrapped phase series $\theta_j$ and outputs a delayed phase series 480. A phase correction summing function 470 adds delayed phase 480 and phase correction 39 from phase transformer 34 in FIG. 3 to form phase correction sum 472.

Figure 5:
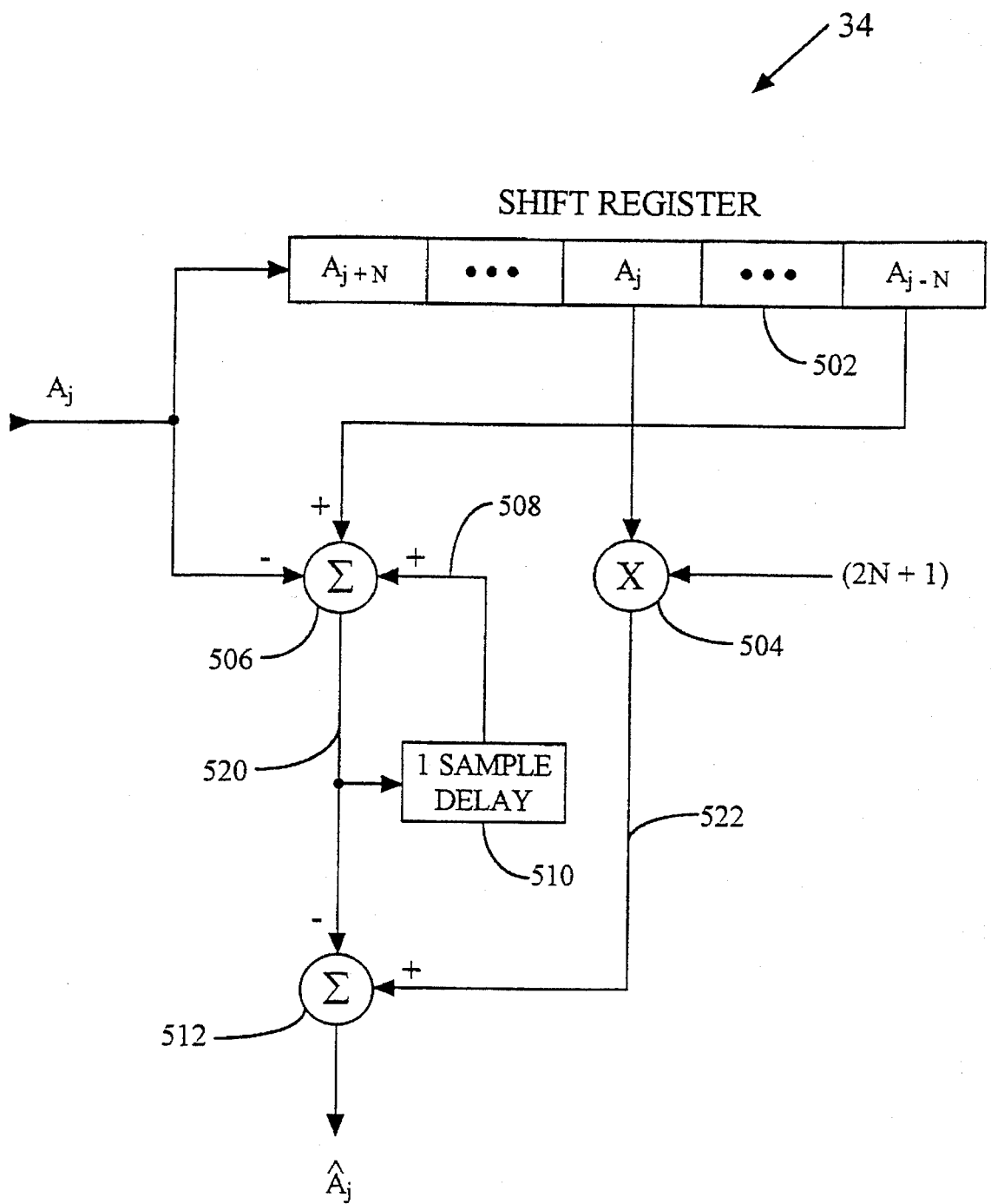
FIG. 5 is a block diagram of an amplitude transformer for the adaptive locally optimum processor of FIG. 3.

By way of example, amplitude transformer 34 of FIG. 3 may be implemented as shown in FIG. 5 to calculate amplitude transform series $A_j$ recursively from $A_j$ from the formula:

$$(2N)A_j^{\wedge} = (2N+1)A_j - \sum_{k=-N}^{N} A_{j+k}$$

A shift register 502 shifts amplitude series $A_j$ across (2N+1) stages, where N is a postive even integer, preferably 8. A multiplier 504 multiplies samples from a middle stage of shift register 502 by (2N+1) to form a middle product 522. A summing function 506 sums samples from an end stage of shift register 502 with a delayed sample series 508 and subtracts amplitude series $A_j$ to form a shift sum series 520. A unit sample delay 510 delays shift sum series 520 to form delayed sum series 508. An output summing function 512 subtracts shift sum series 520 from middle product 522 to form amplitude transform series.

Figure 6:
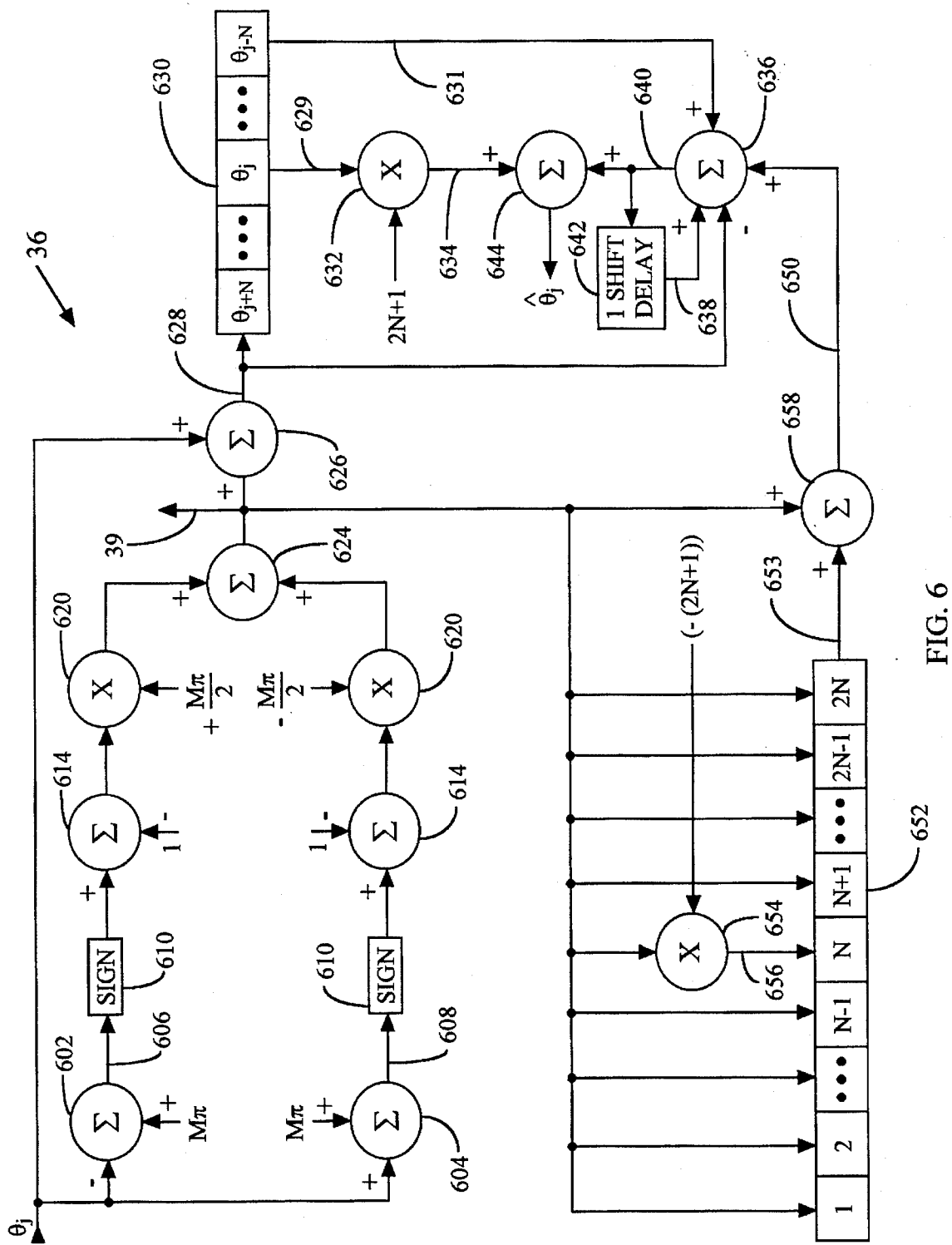
FIG. 6 is a block diagram of a phase transformer for the adaptive locally optimum processor of FIG. 3.

By way of example, phase transformer 36 of FIG. 3 may be implemented as shown in FIG. 6. A lower summing function 602 subtracts unwrapped phase series $\theta_j$ from $M\pi$ to form a lower bound 606, where M is a positive integer. An upper summing function 604 adds unwrapped phase series $\theta_j$ to $M\pi$ to form an upper bound 608. A preferred value for M is 10. An even integer should be chosen for M so that phase correction 39 is not changed more often than once every (2N+1) samples.

Still referring to FIG. 6, sign functions 610, sign summing functions 614, sign multipliers 620, and a collection summing function 624 generate phase correction 39. Phase correction 39 has a value of zero when unwrapped phase series $\theta_j$ has a value of between $-M\pi$ and $+M\pi$. When unwrapped phase series $\theta_j$ has a value less than $-M\pi$ or greater than $+M\pi$, phase correction 39 is changed to $-M\pi$ or $+M\pi$, respectively. A correction summing function 626 adds unwrapped phase series $\theta_j$ and phase correction 39 to form a corrected sum 628. A shift register 630 shifts sum 628 across (2N+1) stages. A sum multiplier 632 multiplies middle stage contents 629 of shift register 630 by (2N+1) to form a middle sum 634. An end stage summing function 636 adds last stage contents 631 of shift register 630, corrected sum 628, a delayed transform sum 638, and a phase transform correction sum 650 to form a phase transform sum 640. A phase unit-delay function 642 delays phase transform sum 640 to output delayed transform sum 638. A phase output summing function 644 adds middle sum 634 and phase transform sum 640 to form phase transform series $\theta_j^{\wedge}$.

Still referring to FIG. 6, a shift register 652 shifts phase correction 39 across 2N stages. A shift multiplier 654 multiplies phase correction 39 by $-(2N+1)$ to form phase product 656 for input to stage N of shift register 652. Shift register 652 loads phase product 656 into stage N and phase correction 39 into stages 1 through (N−1) and (N+1) through 2N when phase correction 39 is non-zero. When phase correction 39 is zero, stage 1 of shift register 652 is loaded with zero. A phase increment sum function 658 adds phase correction increment 653 from stage 2N of shift register 652 and phase correction 39 to form phase transform correction sum 650.

Figure 7:
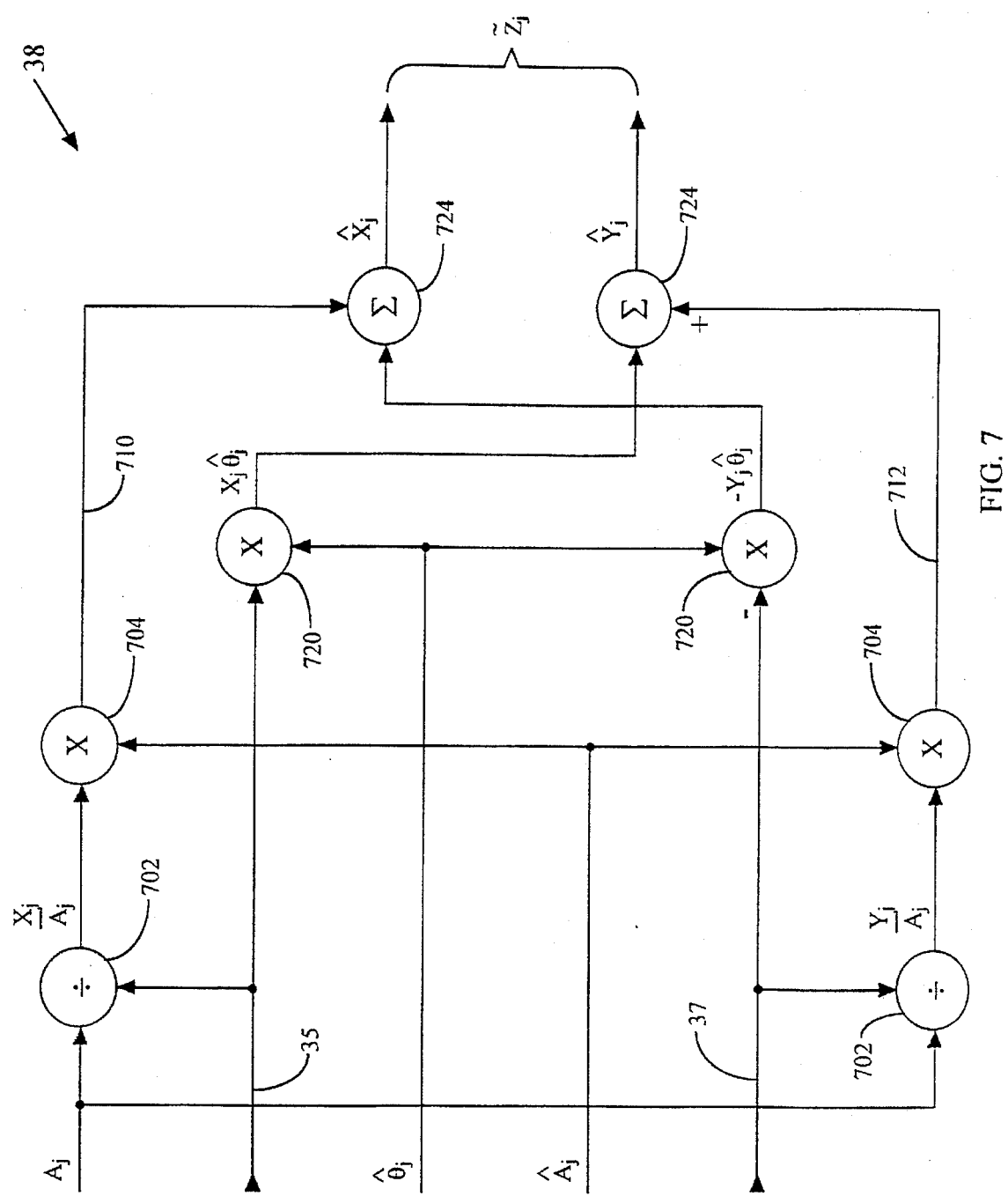
FIG. 7 is a block diagram of a combiner for the adaptive locally optimum processor of FIG. 3.

By way of example, combiner 38 of FIG. 3 may be implemented as shown in FIG. 7. Dividers 702 input delayed series 35 and 37 from delays 31 respectively, and divide by amplitude transform sum $A_j^{\wedge}$ to form quotients $x_j/A_j$ and $y_j/A_j$. Combiner multipliers 704 multiply quotients $x_j/A_j$ and $y_j/A_j$ by amplitude transform sum $A_j^{\wedge}$ respectively to form in-phase product 710 and quadrature product 712. Phase combiner multipliers 720 multiply delayed series 35 and 37 by phase transform sum $\theta_j^{\wedge}$ to form phase products $x_j\theta_j^{\wedge}$ and $-y_j\theta_j^{\wedge}$, respectively. Combiner product summing functions 724 add in-phase product 710 and quadrature product 712 with phase products $x_j\theta_j^{\wedge}$ and $-y_j\theta_j^{\wedge}$ respectively to form combined output $z_j^{\wedge}=(x_j^{\wedge},y_j^{\wedge})$.

Combined output $z_j^{\wedge}$ may then be analyzed by spectrum analyzer 18 in FIG. 1 to display the signal power of the tonal signal in input signal 13 according to well-known techniques.

I claim:

1. A method for processing an input signal having a tonal structure within a frequency band, wherein said input signal is substantially masked by an interfering signal, comprising the steps of:

generating a complex signal from said input signal; and subjecting said complex signal to an adaptive locally optimum process to generate a combined signal representative of said tonal structure.

2. The method of claim 1, further including the step of spectrally analyzing said combined signal to generate a spectral signal.

3. The method of claim 2, further including the step of displaying said spectral signal on a display.

4. The method of claim 1, wherein the step of generating a complex signal includes basebanding the input signal.

5. The method of claim 4, wherein the step of generating a complex signal includes bandpass filtering the basebanded input signal.

6. The method of claim 1, wherein the step of subjecting said complex signal to an adaptive locally optimum process comprises the steps of:

transforming said complex signal into an amplitude series and an unwrapped phase series;

forming an amplitude transform sum from the amplitude series;

forming a phase transform sum from the unwrapped phase series;

delaying the complex signal to form a delayed complex signal; and combining the delayed complex signal, the amplitude series, the amplitude transform sum, and the phase transform sum to form the combined signal.

7. The method of claim 6, wherein the amplitude transform sum is found substantially by the formula $$\hat{A_j} = \frac{1}{2N} \sum_{k=-N}^{N} (A_j - A_{j+k}).$$

8. The method of claim 6, wherein the phase transform sum is found substantially by the formula $$\hat{\theta_j} = \frac{1}{2N} \sum_{k=-N}^{N} (\theta_j - \theta_{j+k}).$$

9. The method of claim 6, wherein the combined signal is found substantially by the formula $$Z_j = \left( \frac{x_j}{A_j}, \frac{y_j}{A_j} \right) \hat{A_j} + (-y_j, x_j)\hat{\theta_j} = (\hat{x}, \hat{y}).$$

10. An apparatus for revealing a tonal structure of an input signal within a frequency band, wherein said input signal is substantially masked by an interfering signal, comprising:
a basebander operably coupled to said input signal to form a complex signal; and
an adaptive locally optimum processor operably coupled to said complex signal to form a combined signal representative of said tonal structure.

11. The apparatus of claim 10, further comprising a spectral analyzer operably coupled to said combined signal for generating a spectral signal representative of said tonal structure.

12. The apparatus of claim 11, further comprising a display operably coupled to said spectral analyzer for displaying said spectral signal.

13. The apparatus of claim 10, further comprising a bandpass filter operably coupled to said complex signal and to said adaptive locally optimum processor.

14. The apparatus of claim 10, wherein said adaptive locally optimum processor comprises:
a coordinate transformer/phase unwrapper operably coupled to said complex signal for transforming said complex signal into an amplitude series and an unwrapped phase series;
an amplitude transformer operably coupled to said amplitude series for forming an amplitude transform sum;
a phase transformer operably coupled to said unwrapped phase series for forming a phase transform sum;
a delay operably coupled to said complex signal for delaying said complex signal to form a delayed complex signal; and
a combiner operably coupled to said delayed complex signal, said amplitude series, said amplitude transform sum, and said phase transform sum for forming said combined signal.

\* \* \* \* \*